(12) United States Patent
Liu

(10) Patent No.: US 12,159,914 B2
(45) Date of Patent: Dec. 3, 2024

(54) TRENCH POWER SEMICONDUCTOR DEVICE

(71) Applicant: Excelliance MOS Corporation, Hsinchu County (TW)

(72) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 420 days.

(21) Appl. No.: 17/704,022

(22) Filed: Mar. 25, 2022

(65) Prior Publication Data

US 2023/0268405 A1     Aug. 24, 2023

(30) Foreign Application Priority Data

Feb. 24, 2022   (TW) ................ 111201932

(51) Int. Cl.
    *H01L 29/06*      (2006.01)
    *H01L 29/423*     (2006.01)
    *H01L 29/739*     (2006.01)

(52) U.S. Cl.
    CPC ...... *H01L 29/4236* (2013.01); *H01L 29/0696* (2013.01); *H01L 29/7397* (2013.01)

(58) Field of Classification Search
    CPC ......... H01L 29/06; H01L 29/10; H01L 29/40; H01L 29/78; H01L 29/417; H01L 29/423; H01L 29/739; H01L 29/0642; H01L 29/0692; H01L 29/0696; H01L 29/407; H01L 29/1095; H01L 29/7803; H01L 29/7813; H01L 29/7397; H01L 29/4236; H01L 29/41766; H01L 27/088; H01L 21/8234; H01L 21/823412; H01L 21/823481; H01L 21/823487
    USPC ........................................................ 257/288
    See application file for complete search history.

(56) References Cited

U.S. PATENT DOCUMENTS

| | | |
|---|---|---|
| 5,316,959 A | 5/1994 | Kwan et al. |
| 6,010,950 A | 1/2000 | Okumura et al. |
| 6,130,458 A | 10/2000 | Takagi et al. |
| 7,511,339 B2 | 3/2009 | Mo et al. |
| 7,781,826 B2 | 8/2010 | Mallikararjunaswamy et al. |

(Continued)

FOREIGN PATENT DOCUMENTS

| | | |
|---|---|---|
| TW | 200943529 | 10/2009 |
| TW | 201413918 | 4/2014 |
| TW | 201807823 | 3/2018 |

*Primary Examiner* — Chuong A Luu
(74) *Attorney, Agent, or Firm* — JCIPRNET

(57) ABSTRACT

A trench power semiconductor device includes a substrate, an epitaxial layer, a drain, a first active device, a second active device, and isolation trench structures. The epitaxial layer and the drain are disposed on two surfaces of the substrate, respectively. The first active device is disposed in a first portion of the epitaxial layer and has a first source and a first gate. The second active device is disposed in a second portion of the epitaxial layer and has a second source and a second gate. The isolation trench structures are disposed between the first portion and the second portion of the epitaxial layer to electrically isolate the first active device and the second active device. Each of the isolation trench structures includes a polysilicon structure with a floating potential and an insulating layer. The insulating layer is between the polysilicon structure and the epitaxial layer.

14 Claims, 3 Drawing Sheets

(56) References Cited

U.S. PATENT DOCUMENTS

| | | |
|---|---|---|
| 8,664,714 B2 | 3/2014 | Liu |
| 2008/0121988 A1* | 5/2008 | Mallikararjunaswamy ................ H01L 27/0727 257/E21.135 |
| 2010/0320461 A1 | 12/2010 | Su et al. |
| 2013/0075809 A1* | 3/2013 | Hsieh ................ H01L 29/66727 438/237 |
| 2019/0267377 A1 | 8/2019 | Ng et al. |
| 2021/0057412 A1 | 2/2021 | Ng et al. |

* cited by examiner

TRENCH POWER SEMICONDUCTOR DEVICE

CROSS-REFERENCE TO RELATED APPLICATION

This application claims the priority benefit of Taiwan application serial no. 111201932, filed on Feb. 24, 2022. The entirety of the above-mentioned patent application is hereby incorporated by reference herein and made a part of this specification.

BACKGROUND

Technology Field

The disclosure relates to a power semiconductor technology, and particularly, to a trench power semiconductor device.

DESCRIPTION OF RELATED ART

Power semiconductor components are generally used in devices such as switch-mode power supplies or other high-speed power switching devices. For higher device density, power semiconductor components often come with a design of vertical structure in which the backside of the chip serves as the drain, and the source and gate are processed on the front side of the chip.

Conventional power semiconductor components are processed on different chips according to different ranges of the applied voltage, and then wafer-level encapsulation is used for circuit connection to prevent current leakage or other electrical problems.

However, separately processing the power semiconductor components on different chips not only wastes time but increases manufacturing costs. Although structures such as thick oxide layers are currently used for electrical isolation of components, additional steps are still required to form the thick oxide layers.

SUMMARY

The disclosure provides a trench power semiconductor device capable of improving the electrical isolation ability between two active devices on the same substrate and requiring no extra long-term thermal oxidation treatment or extra mask process.

The trench power semiconductor device of the disclosure includes a substrate, an epitaxial layer, a drain, a first active device, a second active device, and multiple isolation trench structures. The substrate includes a first surface and a second surface opposite to each other. The epitaxial layer is disposed on the first surface of the substrate. The drain is disposed on the second surface of the substrate. The first active device is disposed in a first portion of the epitaxial layer and includes a first source and a first gate. The second active device is disposed in a second portion of the epitaxial layer and includes a second source and a second gate. Multiple isolation trench structures are disposed between the first portion and the second portion of the epitaxial layer to electrically isolate the first active device and the second active device. Each of the isolation trench structures includes a polysilicon structure with a floating potential extending from a surface of the epitaxial layer into the epitaxial layer. An insulating layer is interposed between the polysilicon structure and the epitaxial layer.

In an embodiment of the disclosure, the number of the isolation trench structures is three or more.

In an embodiment of the disclosure, a cross voltage between the first active device and the second active device is positively related to the number of the isolation trench structures.

In an embodiment of the disclosure, the first active device includes the epitaxial layer with a first type of conductivity, a first well region with a second type of conductivity, multiple first trench gate structures, the first gate, a first source region with the first type of conductivity, and the first source. The first well region is located in the epitaxial layer. The first trench gate structures are disposed in the epitaxial layer and extend from a surface of the epitaxial layer to the first well region thereunder. The first gate is disposed above the epitaxial layer and electrically connected to the first trench gate structure. The first source region is located on the surface of the epitaxial layer, and the first source is disposed above the epitaxial layer and electrically connected to the first source region.

In an embodiment of the disclosure, the trench power semiconductor device may further include multiple first heavily doped regions with the second type of conductivity formed in the first well region under the first source, and the first source is electrically connected to the first heavily doped regions.

In an embodiment of the disclosure, the first gate is disposed around the first source.

In an embodiment of the disclosure, the second active device includes the epitaxial layer with a first type of conductivity, a second well region with a second type of conductivity, multiple second trench gate structures, the second gate, a second source region with the first type of conductivity, and the second source. The second well region is located in the epitaxial layer. The second trench gate structures are disposed in the epitaxial layer and extend from a surface of the epitaxial layer to the second well region thereunder. The second gate is disposed above the epitaxial layer and electrically connected to the second trench gate structure. The second source region is located on the surface of the epitaxial layer, and the second source is disposed above the epitaxial layer and electrically connected to the second source region.

In an embodiment of the disclosure, the trench power semiconductor device further includes multiple second heavily doped regions with the second type of conductivity formed in the second well region under the second source, and the second source is electrically connected to the second heavily doped regions.

In an embodiment of the disclosure, the second gate is disposed around the second source.

In an embodiment of the disclosure, the substrate is a semiconductor substrate with the first type of conductivity.

In an embodiment of the disclosure, the first type of conductivity is N-type, and the second type of conductivity is P-type.

In an embodiment of the disclosure, the first type of conductivity is P-type, and the second type of conductivity is N-type.

In an embodiment of the disclosure, the first active device and the second active device have the same area.

In an embodiment of the disclosure, the area of the first active device is less than the area of the second active device.

In an embodiment of the disclosure, the first active device and the second active device are asymmetrical structures.

In an embodiment of the disclosure, the first active device and the second active device are structures in mirror symmetry.

In summary, in the disclosure, multiple isolation trench structures disposed between the first and second portions of the epitaxial layer are used to electrically isolate the first active device and the second active device, and the isolation trench structures are basically the same as the trench gate structures of the active devices. Therefore, the purpose of configuring two active devices on the same substrate can be implemented without extra long-term thermal oxidation treatment or extra mask process.

In order to make the features and advantages of the disclosure comprehensible, embodiments accompanied with drawings are described in detail below.

DESCRIPTION OF THE EMBODIMENTS

Figure 1:
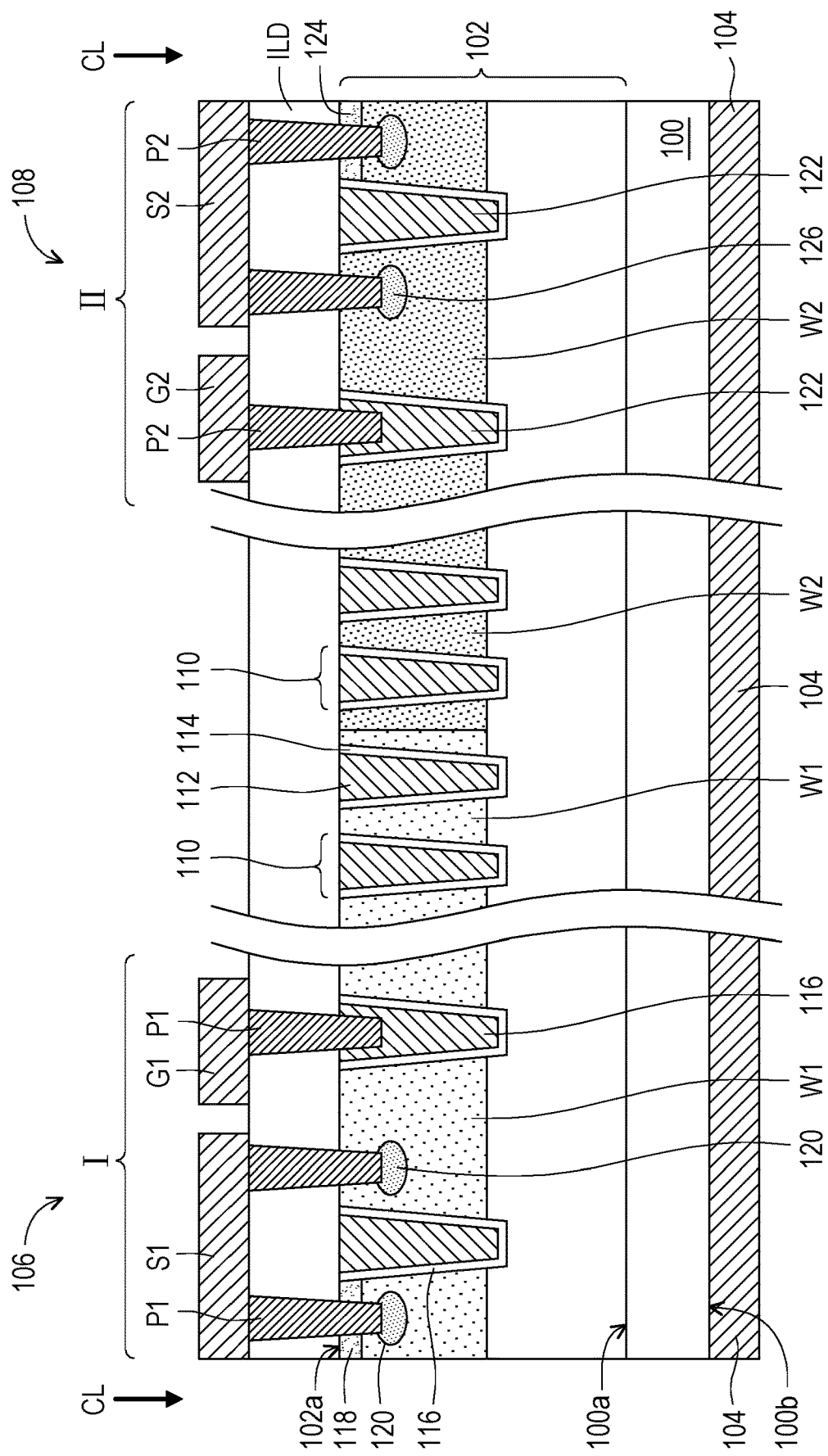
FIG. 1 is a schematic cross-sectional view of a trench power semiconductor device according to an embodiment of the disclosure.

In the following paragraphs, various different implementations or embodiments are illustrated for implementing various features of the disclosure. Moreover, these embodiments are only exemplary and are not intended to limit the scope and the application of the disclosure. Furthermore, for clarity, a relative size (e.g., length, thickness, and distance) and a relative location of each region or each structural component may be reduced or enlarged. Moreover, the same or similar reference numerals are used to represent the same or similar components or features in the drawings.

FIG. 1 is a schematic cross-sectional view of a trench power semiconductor device according to an embodiment of the disclosure.

Referring to FIG. 1, the trench power semiconductor device of the embodiment includes a substrate 100, an epitaxial layer 102, a drain 104, a first active device 106, a second active device 108, and multiple isolation trench structures 110. The substrate 100 has a first surface 100a and a second surface 100b opposite to each other. The epitaxial layer 102 is disposed on the first surface 100a of the substrate 100. The drain 104 is disposed on the second surface 100b of the substrate 100. The first active device 106 is disposed in a first portion I of the epitaxial layer 102 and has a first source S1 and a first gate G1. The second active device 108 is disposed in a second portion II of the epitaxial layer 102 and has a second source S2 and a second gate G2. The isolation trench structures 110 are disposed between the first portion I and the second portion II of the epitaxial layer 102 to electrically isolate the first active device 106 and the second active device 108.

In the embodiment, the first active device 106 and the second active device 108 can share a drain (the drain 104). That is, FIG. 1 illustrates a die and cutting lines CL are just outside the first active device 106 and the second active device 108. Therefore, a circuit diagram of the trench power semiconductor device of the embodiment is as shown in FIG. 2, for example.

Figure 2:
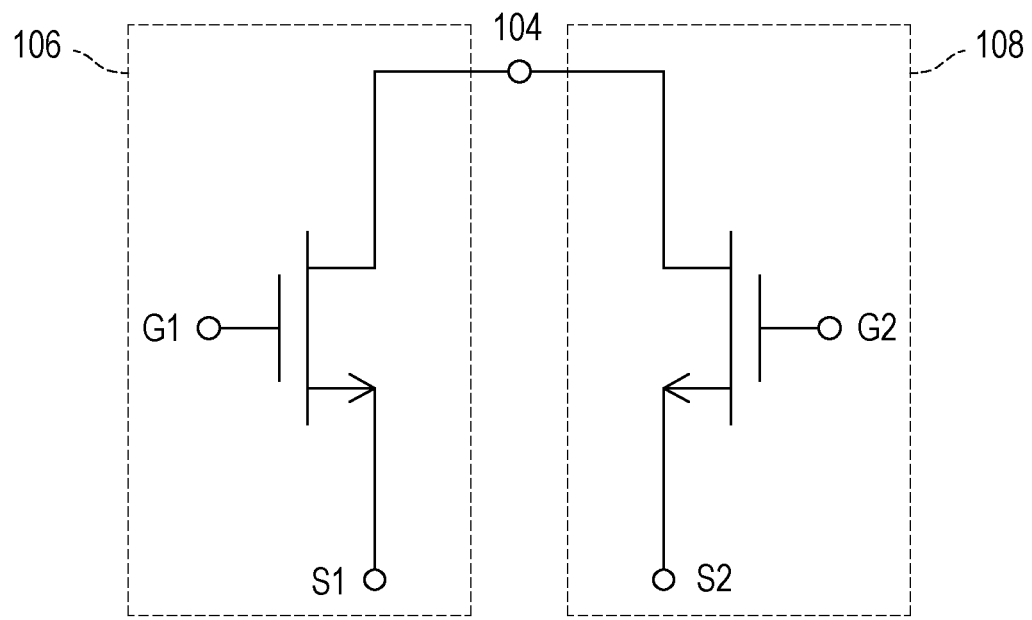
FIG. 2 is a circuit diagram of the trench power semiconductor device of the embodiment.

In FIG. 2, the trench power semiconductor device can be operated in four modes as follows.

In the first mode, an input voltage Vin is the voltage of the first source S1 of the first active device 106 (Vin=V(S1)), an output voltage Vout is the voltage of the second source S2 of the second active device 108 (Vout=V(S2)), both the voltage V(G1) of the first gate G1 of the first active device 106 and the voltage V(G2) of the second gate G2 of the second active device 108 are low voltages. The potentials of the first source S1 and the second source S2 can be intermodulated.

In the second mode, Vin=V(S1), Vout=V(S2), V(G1) are high voltages, and V(G2) is a low voltage. The potentials of the first source S1 and the second source S2 can be intermodulated.

In the third mode, Vin=V(S1), Vout=V(S2), V(G1) are low voltages, and V(G2) is a high voltage. The potentials of the first source S1 and the second source S2 can be intermodulated.

In the fourth mode, Vin=V(S1), Vout=V(S2), V(G1), and V(G2) are all high voltages. The potentials of the first source S1 and the second source S2 can be intermodulated.

Referring to FIG. 1 again, the number of the isolation trench structures 110 is four, but the disclosure is not limited thereto. The cross voltage between the first active device 106 and the second active device 108 is positively related to the number of the isolation trench structures. For example, if the cross voltage between the first active device 106 and the second active device 108 is 30V, the number of the isolation trench structures is 3; if the cross voltage between the first active device 106 and the second active device 108 is greater than 30V, the number of the isolation trench structures can be changed to 4, and so on.

In the embodiment, each isolation trench structure 110 includes a polysilicon structure 112 with a floating potential and an insulating layer 114. The polysilicon structure 112 extends from a surface 102a of the epitaxial layer 102 into the epitaxial layer 102, and the insulating layer 114 is disposed between the polysilicon structure 112 and the epitaxial layer 102.

In the embodiment, the first active device 106 includes the epitaxial layer 102 having a first type of conductivity, a first well region W1 having a second type of conductivity, multiple first trench gate structures 116, the first gate G1, a first source region 118 having the first type of conductivity and the first source S1. In the embodiment, the substrate 100 is a semiconductor substrate having the first type of conductivity, the first type of conductivity is N-type, and the second type of conductivity is P-type. However, the disclosure is not limited thereto. In another embodiment, the first type of conductivity is P-type, and the second type of conductivity is N-type. The first well region W1 is located in the epitaxial layer 102. The first trench gate structure 116 is disposed in the epitaxial layer 102 and extends from the surface 102a of the epitaxial layer 102 to the first well region W1 and thereunder. The first gate G1 is disposed above the epitaxial layer 102 and electrically connected to the first trench gate structure 116, and the first gate G1 can be electrically connected to the first trench gate structure 116 through a conductive plug P1 disposed in a dielectric layer ILD. The first source region 118 is located on the surface 102a of the epitaxial layer 102, the first source S1 is disposed above the epitaxial layer 102 and electrically connected to the first source region 118, and the first source S1 can be electrically connected to the first source region 118 through another conductive plug P1 disposed on the dielectric layer ILD.

In the embodiment, the trench power semiconductor device may further include multiple first heavily doped regions 120 of the second type of conductivity, which are formed in the first well region W1 under the first source S1 to increase an Ohmic contact of the first well region W1. The first source S1 is electrically connected to the first heavily doped region 120, and the first source S1 can be electrically connected to the first heavily doped region 120 through a conductive plug P1 disposed on the dielectric layer ILD.

In the embodiment, the second active device 108 includes the epitaxial layer 102 having the first type of conductivity, a second well region W2 having the second type of conductivity, multiple second trench gate structures 122, the second gate G2, a second source region 124 having the first type of conductivity, and the second source S2. The second well region W2 is located in the epitaxial layer 102. The second trench gate structure 122 is disposed in the epitaxial layer 102 and extends from the surface 102a of the epitaxial layer 102 to the second well region W2 and thereunder. The second gate G2 is disposed above the epitaxial layer 102 and electrically connected to the second trench gate structure 122, and the second gate G2 can be electrically connected to the second trench gate structure 122 through a conductive plug P2 disposed in the dielectric layer ILD. The second source region 124 is located on the surface 102a of the epitaxial layer 102, the second source S2 is disposed above the epitaxial layer 102 and electrically connected to the second source region 124, and the second source S2 can be electrically connected to the second source region 124 through another conductive plug P2 disposed in the dielectric layer ILD.

In the embodiment, the trench power semiconductor device may further include multiple second heavily doped regions 126 of the second type of conductivity, which are formed in the second well region W2 under the second source S2 to increase an Ohmic contact of the second well region W2. The second source S2 is electrically connected to the second heavily doped region 126, and the second source S2 can be electrically connected to the second heavily doped region 126 through the conductive plug P2 disposed in the dielectric layer ILD.

In addition to the first active device 106 and the second active device 108 shown in FIG. 1, the active device of the disclosure can also use components with different structural designs. For example, the active devices of some components in FIG. 1 are omitted, or the active devices of structural layers or the active devices of doped regions are added in FIG. 1, which is not limited to the description of the embodiment.

In one embodiment, the depth of the isolation trench structure 110 may be the same as the depth of the first trench gate structure 116. In another embodiment, the depth of the isolation trench structure 110 may be the same as the depth of the second trench gate structure 122. In yet another embodiment, the depth of the first trench gate structure 116 may be the same as the depth of the second trench gate structure 122. When the depths of the first trench gate structure 116, the second trench gate structure 122, and the isolation trench structure 110 are the same, the three can be formed by the same process.

In FIG. 1, the first well region W1 is adjacent to the second well region W2, and the isolation trench structures 110 are located in part of the first well region W1 and part of the second well region W2, respectively. Moreover, part of the isolation trench structure 110 extends from the surface 102a of the epitaxial layer 102 to the first well region W1 and thereunder, and another part of the isolation trench structure 110 extends from the surface 102a of the epitaxial layer 102 to the second well region W2 and thereunder. However, the disclosure is not limited thereto; in another embodiment, the first well region W1 is not adjacent to the second well region W2, and the isolation trench structures 110 are not disposed in the first well region W1 and the second well region W2 but in the epitaxial layer 102 between the first well region W1 and the second well region W2.

FIG. 1 illustrates a cross-section of a trench power semiconductor device, and the top view thereof may include the following examples.

Figure 3A:
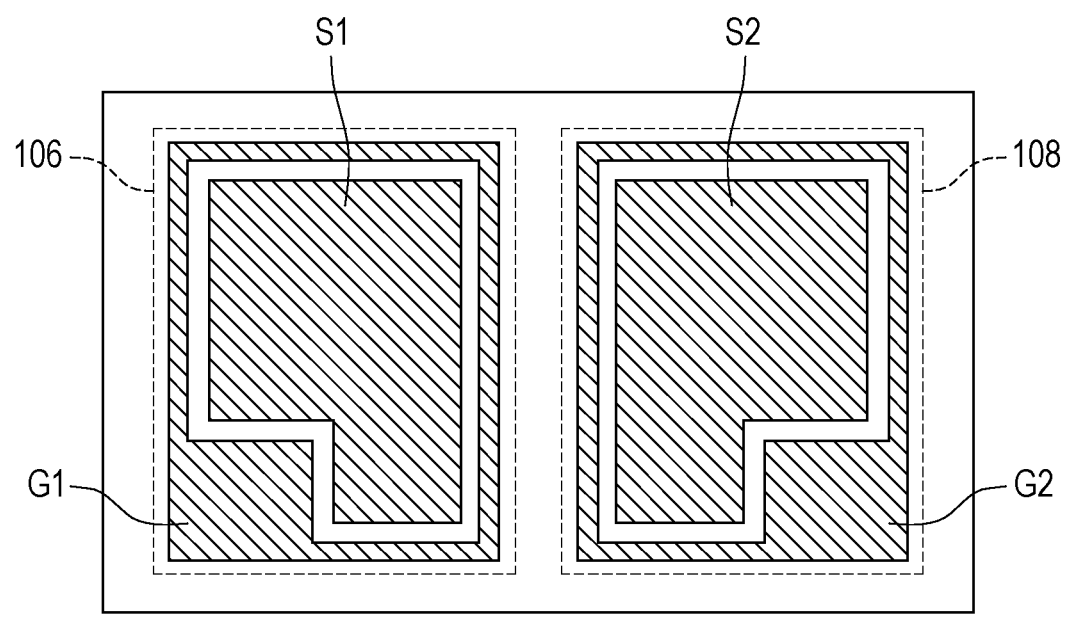
FIG. 3A is a schematic top view of an example of the embodiment.

FIG. 3A is a schematic top view of an example of the embodiment. In FIG. 3A, the first active device 106 and the second active device 108 have the same area, and the isolation trench structure (not shown) of the disclosure is disposed around and between the first active device 106 and the second active device 108. In FIG. 3A, the first active device 106 and the second active device 108 are structures in mirror symmetry, the first gate G1 is disposed around the first source S1, and the second gate G2 is disposed around the second source S2.

Figure 3B:
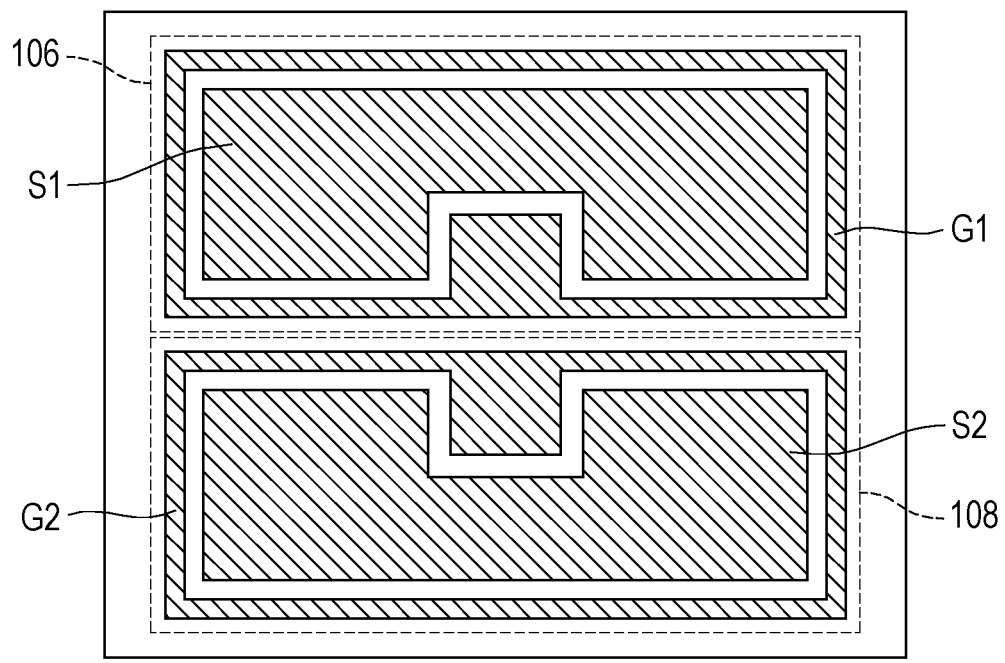
FIG. 3B is a schematic top view of another example of the embodiment.

FIG. 3B is a schematic top view of another example of the embodiment. In FIG. 3B, the first active device 106 and the second active device 108 have the same area, and the isolation trench structure (not shown) of the disclosure is disposed around and between the first active device 106 and the second active device 108. In FIG. 3B, the first active device 106 and the second active device 108 are structures in mirror symmetry, the first gate G1 is disposed around the first source S1, and the second gate G2 is disposed around the second source S2.

Figure 3C:
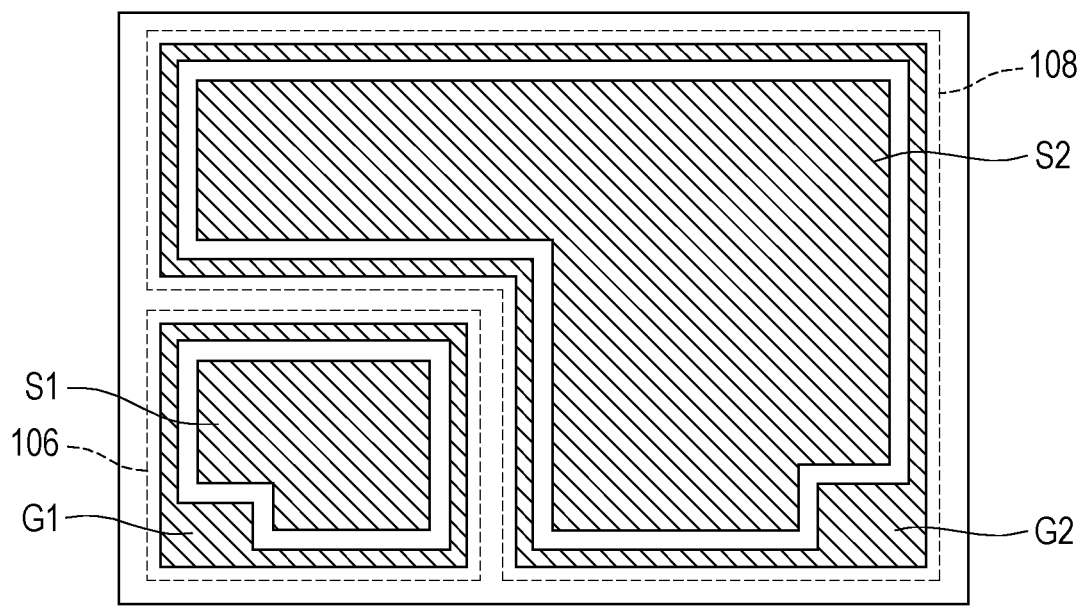
FIG. 3C is a schematic top view of yet another example of the embodiment.

FIG. 3C is a schematic top view of yet another example of the embodiment. In FIG. 3C, the area of the first active device 106 is less than the area of the second active device 108, and the isolation trench structure (not shown) of the disclosure is disposed around and between the first active device 106 and the second active device 108. In FIG. 3C, the first active device 106 and the second active device 108 are asymmetrical structures, the first gate G1 is disposed around the first source S1, and the second gate G2 is disposed around the second source S2.

In summary, in the trench power semiconductor device of the disclosure, two active devices are disposed on the same substrate, multiple isolation trench structures disposed between the two active devices are used for electrical isolation, and the isolation trench structures are basically the same as the trench gate structures of the active devices, so an extra long-term thermal oxidation treatment or an extra mask process is not required. Moreover, the disclosure can also preset the quantity of the isolation trench structures according to the cross voltage between the two active devices.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A trench power semiconductor device, comprising:
a substrate comprising a first surface and a second surface opposite to each other;
an epitaxial layer disposed on the first surface of the substrate;
a drain disposed on the second surface of the substrate;
a first active device disposed in a first portion of the epitaxial layer and comprising:
a first well region located in the epitaxial layer;
a plurality of first trench gate structures disposed in the epitaxial layer and extending from a surface of the epitaxial layer to the first well region thereunder;
a first source region located on a portion of the first well region;
a first source disposed above the epitaxial layer and electrically connected to the first source region; and
a first gate disposed above the epitaxial layer and electrically connected to the plurality of first trench gate structures, wherein in a top view, the first source is surrounded by the first gate;
a second active device disposed in a second portion of the epitaxial layer and comprising:
a second well region located in the epitaxial layer;
a plurality of second trench gate structures disposed in the epitaxial layer and extending from the surface of the epitaxial layer to the second well region thereunder;
a second source region located on a portion of the second well region;
a second source disposed above the epitaxial layer and electrically connected to the second source region; and
a second gate disposed above the epitaxial layer and electrically connected to the plurality of second trench gate structures, wherein in the top view, the second source is surrounded by the second gate; and
a plurality of isolation trench structures disposed between the first gate and the second gate to electrically isolate the first active device and the second active device, wherein each of the isolation trench structures comprises:
a polysilicon structure comprising a floating potential and extending from the surface of the epitaxial layer into the epitaxial layer; and
an insulating layer interposed between the polysilicon structure and the epitaxial layer.

2. The trench power semiconductor device according to claim 1, wherein a number of the isolation trench structures is three or more.

3. The trench power semiconductor device according to claim 1, wherein a cross voltage between the first active device and the second active device is positively related to a number of the isolation trench structures.

4. The trench power semiconductor device according to claim 1, wherein in the first active device,
the epitaxial layer has a first type of conductivity;
the first well region has a second type of conductivity; and
the first source region has the first type of conductivity.

5. The trench power semiconductor device according to claim 4, further comprising a plurality of first heavily doped regions with the second type of conductivity formed in the first well region under the first source, wherein the first source is electrically connected to the first heavily doped regions.

6. The trench power semiconductor device according to claim 4, wherein the substrate is a semiconductor substrate with the first type of conductivity.

7. The trench power semiconductor device according to claim 6, wherein the first type of conductivity is N-type, and the second type of conductivity is P-type.

8. The trench power semiconductor device according to claim 6, wherein the first type of conductivity is P-type, and the second type of conductivity is N-type.

9. The trench power semiconductor device according to claim 1, wherein in the second active device,
the epitaxial layer has a first type of conductivity;
the second well region has a second type of conductivity located; and
the second source region has the first type of conductivity.

10. The trench power semiconductor device according to claim 9, further comprising a plurality of second heavily doped regions with the second type of conductivity formed in the second well region under the second source, wherein the second source is electrically connected to the second heavily doped regions.

11. The trench power semiconductor device according to claim 1, wherein in the top view, the first active device and the second active device comprise a same area.

12. The trench power semiconductor device according to claim 1, wherein in the top view, an area of the first active device is less than an area of the second active device.

13. The trench power semiconductor device according to claim 1, wherein in the top view, the first active device and the second active device are asymmetrical structures.

14. The trench power semiconductor device according to claim 1, wherein in the top view, the first active device and the second active device are structures in mirror symmetry.

* * * * *